United States Patent
Chen et al.

(10) Patent No.: US 12,324,274 B2
(45) Date of Patent: Jun. 3, 2025

(54) OPTOELECTRONIC SEMICONDUCTOR CHIP AND METHOD FOR PRODUCING OPTOELECTRONIC SEMICONDUCTOR CHIPS

(71) Applicant: OSRAM Opto Semiconductors GmbH, Regensburg (DE)

(72) Inventors: Xiaojun Chen, Penang (MY); Heng Wang, Eriskirch (DE); Jong Ho Na, Regensburg (DE); Alvaro Gomez-Iglesias, Regensburg (DE); Jürgen Off, Regensburg (DE); Philipp Drechsel, Regensburg (DE); Thomas Lehnhardt, Regensburg (DE)

(73) Assignee: OSRAM Opto Semiconductors GmbH, Regensburg (DE)

(*) Notice: Subject to any disclaimer, the term of this patent is extended or adjusted under 35 U.S.C. 154(b) by 442 days.

(21) Appl. No.: 17/775,195

(22) PCT Filed: Oct. 6, 2020

(86) PCT No.: PCT/EP2020/078010
§ 371 (c)(1),
(2) Date: May 6, 2022

(87) PCT Pub. No.: WO2021/089264
PCT Pub. Date: May 14, 2021

(65) Prior Publication Data
US 2022/0393062 A1    Dec. 8, 2022

(30) Foreign Application Priority Data
Nov. 7, 2019    (DE) .................... 10 2019 217 229.6

(51) Int. Cl.
*H01L 33/06* (2010.01)
*H01L 25/075* (2006.01)
(Continued)

(52) U.S. Cl.
CPC ....... *H10H 20/812* (2025.01); *H01L 25/0753* (2013.01); *H10H 20/0137* (2025.01);
(Continued)

(58) Field of Classification Search
CPC ... H01L 33/007; H01L 33/0075; H01L 33/06; H01L 33/24
See application file for complete search history.

(56) References Cited

U.S. PATENT DOCUMENTS 5,872,022 A * 2/1999 Motoda ............... H01L 21/0262
257/E21.123
2018/0062031 A1* 3/2018 Hirai ..................... H10F 77/146
(Continued)

FOREIGN PATENT DOCUMENTS

| CN | 103904171 | 7/2014 |
| CN | 106711300 A | 5/2017 |
| CN | 105489725 B | 10/2018 |

*Primary Examiner* — Jaehwan Oh
(74) *Attorney, Agent, or Firm* — Slater Matsil, LLP

(57) ABSTRACT

In an embodiment an optoelectronic semiconductor chip includes a semiconductor layer sequence including a first semiconductor region of a first conductivity type, an active zone having a multiple quantum well structure composed of a plurality of quantum well layers and barrier layers, a second semiconductor region of a second conductivity type and a plurality of channels extending through the active zone, wherein the second semiconductor region is located in the channels and is configured for lateral current injection into the active zone, wherein the channels have a first aperture half-angle in the first semiconductor region and a second aperture half-angle in the active zone, and wherein the second aperture half-angle is greater than zero and less than the first aperture half-angle.

20 Claims, 5 Drawing Sheets

(51) Int. Cl.
*H10H 20/01* (2025.01)
*H10H 20/81* (2025.01)
*H10H 20/812* (2025.01)
*H10H 20/816* (2025.01)
*H10H 20/821* (2025.01)
*H10H 20/825* (2025.01)

(52) U.S. Cl.
CPC ........ *H10H 20/816* (2025.01); *H10H 20/821* (2025.01); *H10H 20/8215* (2025.01); *H10H 20/825* (2025.01)

(56) References Cited

U.S. PATENT DOCUMENTS

2018/0083160 A1* 3/2018 Meyer ..................... H01S 5/34
2018/0138358 A1* 5/2018 Zhang .................. H10H 20/814

* cited by examiner

OPTOELECTRONIC SEMICONDUCTOR CHIP AND METHOD FOR PRODUCING OPTOELECTRONIC SEMICONDUCTOR CHIPS

This patent application is a national phase filing under section 371 of PCT/EP2020/078010, filed Oct. 6, 2020, which claims the priority of German patent application 102019217229.6, filed Nov. 7, 2019, each of which is incorporated herein by reference in its entirety.

TECHNICAL FIELD

An optoelectronic semiconductor chip is provided. A production method for optoelectronic semiconductor chips is furthermore provided.

BACKGROUND

Printed publications US 2018/0062031 A1 and US 2018/0083160 A1 relate to light-emitting diode chips with a semiconductor layer sequence that has V-defects.

SUMMARY

Embodiments provide an optoelectronic semiconductor chip that has a high efficiency.

According to at least one embodiment, the semiconductor chip comprises a semiconductor layer sequence. The semiconductor layer sequence is preferably based on a III-V compound semiconductor material. The semiconductor material is, for example, a nitride compound semiconductor material such as $Al_nIn_{1-n-m}Ga_mN$ or a phosphide compound semiconductor material such as $Al_nIn_{1-n-m}Ga_mP$, or alternatively an arsenide compound semiconductor material such as $Al_nIn_{1-n-m}Ga_mAs$ or such as $Al_nGa_mIn_{1-n-m}As_kP_{1-k}$, respectively with $0 \leq n \leq 1$, $0 \leq m \leq 1$ and $n+m \leq 1$ as well as $0 \leq k < 1$. In this case, for example, for at least one layer or for all layers of the semiconductor layer sequence, $0 < n \leq 0.8$, $0.4 \leq m < 1$ and $n+m \leq 0.95$ as well as $0 < k \leq 0.5$. In this case, the semiconductor layer sequence may comprise dopants and additional constituents. For the sake of simplicity, however, only the essential constituents of the crystal lattice of the semiconductor layer sequence are indicated, that is to say Al, As, Ga, In, N or P, even though these may be partially replaced and/or supplemented with small amounts of further materials.

Particularly preferably, the semiconductor layer sequence is based on the material system $Al_nIn_{1-n-m}Ga_mN$, abbreviated to AlInGaN, or $In_{1-m}Ga_mN$, abbreviated to InGaN.

According to at least one embodiment, the semiconductor layer sequence comprises a first semiconductor region of a first conductivity type and a second semiconductor region of a second conductivity type, which is different to the first conductivity type. In particular, the first semiconductor region is n conductive and the second semiconductor region is correspondingly p-conductive.

According to at least one embodiment, the semiconductor layer sequence comprises an active zone. The active zone is adapted for radiation generation, in particular for the generation of near-ultraviolet radiation, blue light and/or green light. As an alternative or in addition, yellow or red light may also be generated in the active zone.

According to at least one embodiment, the active zone comprises a multiple quantum well structure or the active zone is a multiple quantum well structure. The multiple quantum well structure is composed of a plurality of quantum well layers and barrier layers, the quantum well layers and the barrier layers being arranged alternating with one another.

According to at least one embodiment, there are a multiplicity of channels in the semiconductor layer sequence. The channels preferably extended fully through the active zone. This means that the channels may be so-called V-defects, or V-pits. Starting from the first semiconductor region and/or a growth substrate, the channels therefore widen along the main growth direction.

According to at least one embodiment, the active zone lies between the first and second semiconductor regions as seen along a main growth direction of the semiconductor layer sequence. This applies particularly in areas in which the active zone for radiation generation is provided, that is to say particularly in areas next to the channels. The main growth direction is, in particular, oriented perpendicularly to a main face of a growth substrate of the semiconductor layer sequence and/or perpendicularly to a main plane of the semiconductor layer sequence. The main plane is preferably a c-plane, or extends parallel to a c plane, in particular of GaN. The channels preferably extend along the main growth direction.

According to at least one embodiment, the second semiconductor region fills the channels partially or fully. The second semiconductor region in the channels is therefore adapted for lateral current injection into the active zone, in particular for injection of holes. Laterally means, in particular, in a direction perpendicular to the main growth direction.

According to at least one embodiment, the channels have a first aperture angle, also referred to as 2B, in the first semiconductor region. In the active zone, the channels have a second aperture angle, also referred to as 2A. Accordingly, a first aperture half-angle is equal to the angle B and a second aperture half-angle is equal to the angle A. In this case, as seen in a cross section parallel to the main growth direction, the channels are configured approximately in a V-shape, so that these Vs have at least two, in particular precisely two, different aperture angles.

According to at least one embodiment, the second aperture half-angle is greater than or equal to 0 and furthermore less than or equal to the first aperture half-angle. In particular, the second aperture angle is greater than 0 and less than the first aperture angle. This means that $0 \leq A \leq B$ or, preferably, $0 < A < B$.

In at least one embodiment, the optoelectronic semiconductor chip comprises a semiconductor layer sequence. The semiconductor layer sequence contains a first semiconductor region of a first conductivity type, an active zone for radiation generation, having a multiple quantum well structure which is composed of a plurality of quantum well layers and barrier layers, and a second semiconductor region of a second conductivity type. A multiplicity of channels extend through the active zone. The active zone lies between the first semiconductor region and the second semiconductor region, as seen along a main growth direction of the semiconductor layer sequence. The second semiconductor region fills the channels and is adapted for lateral current injection into the active zone. The channels have a first aperture half-angle in the first semiconductor region and a second aperture half-angle in the active zone. The second aperture half-angle is greater than 0 and less than the first aperture half-angle.

For light emitting diodes which are based on InGaN, pyramidal channels which are V-shaped in cross section, so-called V-pits, may be used in order to achieve improved delivery of current from an electrical contact into the active zone. In this case, a flow of current takes place along the main growth direction, particularly in the p-conductive material in the channels, and charge carrier transport thereupon takes place into the individual quantum well layers, which are grown in particular parallel to a c-plane. This charge carrier injection may also be referred to as V-pit injection.

In order to optimize the V-pit injection, all layers, including the multiple quantum well structure on side walls of the channels must be sufficiently doped, in particular p-doped, especially with magnesium. This means that each quantum well layer, which is grown as a continuation more thinly on the side walls of the channels, must be doped and is used for current injection into the c-plane areas of the multiple quantum well structure.

Since doping, in particular with magnesium, within the multiple quantum well structure considerably reduces an internal quantum efficiency, the doping of the layers on the side walls of the channels cannot be carried out by doping during the growth of the layers in question, and such doping is instead to be achieved in particular by means of diffusion, especially of magnesium. However, the diffusion is determined by a diffusion length which depends on the growth conditions of the second semiconductor region, that is to say especially of the p-region, especially on the temperature, the growth rate and the pressure during the growth.

With the semiconductor chip described here, a gradient of the diffusion, especially of magnesium, over the quantum well layers may be reduced by reducing a distance of the c-plane multiple quantum well structure from the layers grown in a p-doped fashion in the area of the side walls of the channels. Otherwise, the continuation of the quantum well layer grown last on the side walls of the channels, which is located close to the second semiconductor region in the channels, has a higher magnesium concentration or dopant concentration than the continuation of the quantum well layer grown first, which has a large distance from the second semiconductor region in the channels.

This doping gradient results in inhomogeneities in the distribution of holes over the multiple quantum well structure, and therefore influences the recombination of charge carriers in the active zone. With strongly pronounced doping gradients, the more deeply lying quantum well layers grown first thus usually emit significantly less light than the upper quantum well layers. This is revealed, for example, by color-coded experiments in which the various quantum well layers are configured for the emission of light with different colors.

Correspondingly, the external quantum efficiency is reduced in the case of a nonuniform charge carrier distribution over the quantum well layers, especially with relatively high current densities, since not all of the active zone can be used for the charge carrier recombination, resulting in a larger performance decrease, or droop. In the case of a fixed diffusion length of a dopant, such as magnesium, in conventional light-emitting diode structures the effects that are associated with nonuniform charge carrier injection increase with an increasing number of quantum well layers.

One possible way of influencing the diffusion length, in particular of magnesium, is to modify the growth conditions such as growth rate, temperature and material composition during the growth of the second semiconductor region. In the case of an increased magnesium diffusion length, however, this leads to more magnesium penetrating into the c-plane areas of the multiple quantum well structure, which degrades the quality of the active zone. The quality and doping of the second semiconductor region furthermore influence other parameters such as an ESD durability, a forward voltage and an operating current, ESD standing for electrostatic discharge. Taking these parameters into account likewise restricts the freedom in the selection of the growth conditions of the second semiconductor region, and makes optimization of the doping gradient difficult.

In order to increase the uniformity of the charge carrier distribution in the multiple quantum well structure, V-pit injection is used in the multiple quantum well structure described here, different aperture angles of the transition region from the side walls to the c-plane quantum well structure areas being employed. In particular, the aperture angle 2A is increased in the region of the multiple quantum well structure so that this aperture angle 2A approaches an aperture angle 2B of the channels in the region of the first semiconductor region.

By the increase of the aperture angle 2A, a distance of the multiple quantum well structure on the side walls of the channels decreases toward the second semiconductor region. The quantum well layers on the side walls therefore occupy a smaller area within the diffusion length, in particular of magnesium, resulting in a lower dopant gradient in the quantum well layers along the main growth direction. A particularly uniform charge carrier distribution may be achieved if a distance between the second semiconductor region and the multiple quantum well structure, which is grown in a c-plane, is as small as possible. In this case, A preferably lies between 0 and B, and is in particular close to B.

The value of the angle A may in this case be varied, which modifies the magnesium distribution profile on the side walls of the multiple quantum well structure. A modification of the angle A may, for example, be achieved by setting the growth conditions differently during the growth of the multiple quantum well structure. A larger aperture angle A may, in particular, be achieved by using
  a lower growth temperature for the barrier layers,
  a lower pressure during the growth of the barrier layers,
  an increased flow rate of H2 in the process gas during the growth of the barrier layers, and/or
  a different, in particular lower, V/III ratio, that is to say ratio of nitrogen components to alkyl components, during the growth of the barrier layers.

By the configuration of the channels as described here, a higher light-emitting diode efficiency may be achieved. Furthermore, a higher flexibility and reduced complexity may be achieved during the growth of the semiconductor layers, particularly compared with adapting the growth conditions of the second semiconductor region. Unlike when adapting the growth conditions of the second semiconductor region, with the adapted growth conditions fewer interactions with other component properties, such as forward voltage or ESD strength, occur for the channels described here.

According to at least one embodiment, the second aperture half-angle A is at least 45% or 55% or 65% or 75% of the first aperture half-angle B. As an alternative or in addition, this value is at most 95% or 85% or 80%. In particular, the second aperture half-angle A is at least 65% and at most 80% of the first aperture half-angle B.

According to at least one embodiment, the semiconductor layer sequence is based on the material system (Al)InGaN, and the first conductivity type is n-conductive and the second conductivity type is p-conductive. Particularly in this configuration, the first aperture half-angle B is at least 15° or at least 24° and/or at most 35° or at most 34°, in particular 26°+/−1° or 32°+/−1°.

According to at least one embodiment, the second aperture half-angle A is between 8° and 28° inclusive or between 13° and 19° inclusive. For example, the second aperture half-angle A is 18°+/−10° or 18°+/−2° or 18°+/−1°. This applies in particular when the first aperture half-angle B is 32°+/−1°. If the first aperture half-angle B is 26°+/−1°, the second aperture half-angle A is in particular 14°+/−1°.

According to at least one embodiment, side walls of the channels are formed by more thinly grown continuations of layers of the multiple quantum well structure. In other words, the multiple quantum well structure also grows in the region of the channels, but more thinly since different crystal faces are grown on.

According to at least one embodiment, a dopant concentration of a sublayer, closest to the side walls, of the second semiconductor region or of the second semiconductor region as a whole, at least inside the channels, is at least $7 \times 10^{18}$ per $cm^3$ or $10^{19}$ per $cm^3$. These values apply particularly in the finished semiconductor chip. This means that there is a relatively high p-dopant concentration at an interface of the relevant sublayer of the second semiconductor region toward the continuations of the layers of the multiple quantum well structure on the side walls.

According to at least one embodiment, the dopant concentration on the side walls decreases by at most 60% or 40% or 30% from the closest sublayer of the second semiconductor region toward the c-plane areas of the multiple quantum well structure. In other words, there is a relatively low dopant concentration gradient on the side walls in a direction perpendicular to the side walls. The same preferably applies for a dopant concentration gradient in the continuations on the side walls in a direction parallel to the side walls.

According to at least one embodiment, a charge carrier recombination rate in the quantum well layers varies by at most a factor of 4 or a factor of 3 or a factor of 2.5 over the multiple quantum well structure in intended use of the semiconductor chip during its operation. In other words, the individual quantum well layers contribute relatively homogeneously to the radiation production. This is achieved, in particular, by the above-described selection of the aperture angles A, B of the V shaped channels.

According to at least one embodiment, the continuations of the layers of the multiple quantum well structure have, in a direction perpendicular to the side walls, a thickness on the side walls of between at least 10% or 20% of an overall thickness of the multiple quantum well structure intended for radiation generation, measured along the main growth direction and next to the channels. As an alternative or in addition, this thickness is at most 40% or 30% or 25% of the overall thickness.

According to at least one embodiment, the first aperture half-angle B changes at a bending point to the second aperture angle A, as seen in a cross section parallel to the main growth direction. This bending point preferably lies with a tolerance of at most 50 nm or 30 nm or 20 nm on a first of the quantum well layers along the main growth direction, in particular on or below the first quantum well layer along the main growth direction. In other words, the bending point preferably lies at a start of the active zone and therefore at a boundary between the active zone and the first semiconductor region.

According to at least one embodiment, the channels are present in a plan view of the semiconductor layer sequence with a numerical surface density of at least $5 \times 10^7$ per $cm^3$ or at least $8 \times 10^7$ per $cm^3$. As an alternative or in addition, this value is at most $1 \times 10^9$ per $cm^3$ or at most $5 \times 10^8$ per $cm^3$.

According to at least one embodiment, the channels have a diameter or average diameter at least of 150 nm or 200 nm or 250 nm on a last of the quantum well layers along the main growth direction. As an alternative or in addition, this diameter or average diameter is at most 550 nm or 450 nm or 350 nm. As seen in a plan view of the active zone, the channels preferably have a hexagonal cross section in the plane of the last of the quantum well layers along the main growth direction.

According to at least one embodiment, a thickness of the semiconductor layer sequence is at least 2 μm or 3 μm or 4 μm overall. As an alternative or in addition, this thickness is at most 18 μm or 15 μm or 10 μm or 6 μm.

According to at least one embodiment, the first semiconductor region comprises a generation layer. The generation layer is adapted for the formation of the channels. In particular, at least 70% or 80% or 90% of the channels are formed in or on the generation layer. This means that the channels are deliberately generated by means of the generation layer. As an alternative to such a generation layer in the first semiconductor region, a growth substrate or a buffer layer on a growth substrate may be correspondingly structured in order to generate the channels directly starting on the growth substrate or on the buffer layer. Such a growth substrate is, for example, a patterned sapphire substrate, abbreviated to PSS.

According to at least one embodiment, the quantum well layers each have a thickness of at least 2 nm and/or at most 5 nm. This applies particularly in the areas next to the channels.

According to at least one embodiment, the barrier layers each have a thickness of at least 3 nm or 4 nm. As an alternative or in addition, the thicknesses of the barrier layers are at most 20 nm or 15 nm. The aforementioned values apply particularly in the areas next to the channels.

According to at least one embodiment, the active zone comprises at least five or eight of the quantum well layers. As an alternative or in addition, the active zone comprises at most 50 or at most 20 of the quantum well layers.

According to at least one embodiment, the optoelectronic semiconductor chip is a light-emitting diode, abbreviated to LED. In particular, the semiconductor chip is then adapted for the generation of blue light and/or green light and/or yellow light and/or red light and/or ultraviolet radiation.

A production method is furthermore provided. Optoelectronic semiconductor chips as described in connection with one or more of the embodiments mentioned above are preferably produced by the production method. Features of the production method are therefore also disclosed for the optoelectronic semiconductor chips, and vice versa.

In at least one embodiment, the method comprises the following steps, particularly in the order specified:
  growing the first semiconductor region and initiating the channels, the channels growing with the first aperture half-angle B,
  growing the active zone, the channels growing with the second aperture half-angle A, and
  growing the second semiconductor region and filling the channels with a semiconductor material of the second semiconductor region.

According to at least one embodiment of the method, the barrier layers are grown at a temperature which is at least 20° C. or 30° C. and/or at most 150° C. or 70° C. or 60° C. or 50° C. higher than a temperature during the growth of the quantum well layers. The growth temperatures for the barrier layers and for the quantum well layers are preferably at least 700° C. and/or at most 900° C.

According to at least one embodiment, the barrier layers are grown from GaN and the quantum well layers are grown from InGaN, in particular grown undoped in each case.

According to at least one embodiment, the quantum well layers are grown with a higher growth rate than the barrier layers. For example, the growth rates differ at least by a factor of 1.2 or 1.5 and/or at most by a factor of 5 or 3 from one another.

BRIEF DESCRIPTION OF THE DRAWINGS

An optoelectronic semiconductor chip as described here and a production method as described here will be explained in more detail below with reference to the drawing with the aid of exemplary embodiments. References which are the same in this case indicate elements which are the same in the individual figures. Relationships are in this case not represented true to scale, however, but instead individual elements may be represented exaggeratedly large for better understanding.

DETAILED DESCRIPTION OF ILLUSTRATIVE EMBODIMENTS

Figure 1:
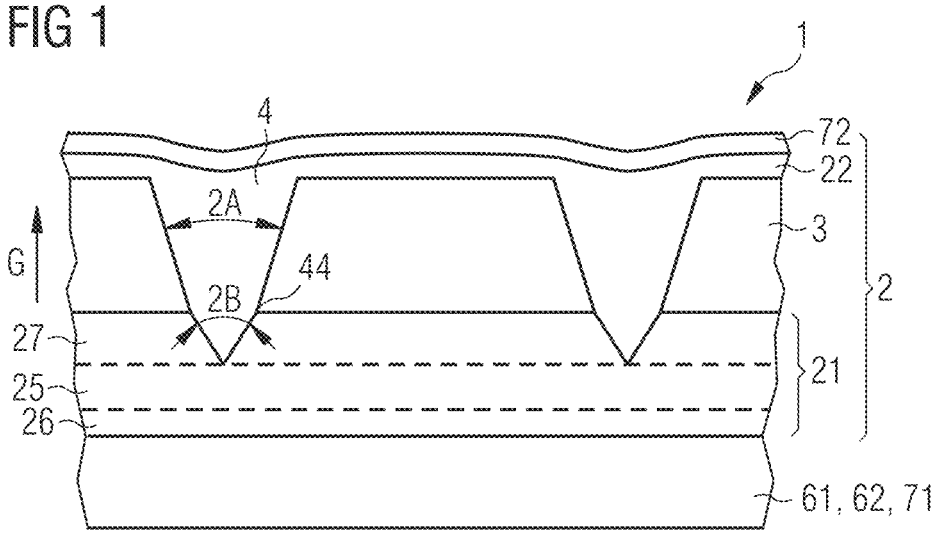
FIG. 1 shows a schematic sectional representation of an exemplary embodiment of an optoelectronic semiconductor chip.

FIG. 1 shows an exemplary embodiment of an optoelectronic semiconductor chip 1. The semiconductor chip 1 comprises a semiconductor layer sequence 2, which is based in particular on the material system InGaN. The semiconductor layer sequence 2 is located on a growth substrate 61, which is made for example of sapphire or silicon.

The semiconductor layer sequence 2 comprises a first semiconductor region 21, which is preferably n-doped, an active zone 3 having a multiple quantum well structure (not shown in FIG. 1) and a second semiconductor region 22, which is preferably p-doped. Starting from the first semiconductor region 21, approximately V-shaped channels 4 extend through the active zone 3. The channels 4, also referred to as V-pits, are filled, preferably fully, by a semiconductor material of the second semiconductor region 22.

The first semiconductor region 21 optionally comprises a buffer layer 26 directly on the growth substrate 61. The buffer layer may be followed by a generation layer 25 for the channels 4. At least most of the channels 4 are formed in or on the generation layer 25. The first semiconductor region 21 furthermore optionally comprises an intermediate layer 27. The intermediate layer 27 may be a single layer, for example of GaN, in order to allow high-quality growth of the active zone 3. As an alternative, the intermediate layer 27 is a superlattice structure having a multiplicity of sublayers (not shown).

The channels 4 have a first aperture angle 2B inside the first semiconductor region 21 and a second aperture angle 2A in the region of the active zone 3. At a boundary between the active zone 3 and the first semiconductor region 21, the aperture angles A, B change over to one another at a bending point 44. The channels 4 therefore widen continuously along a main growth direction G of the semiconductor layer sequence 2. The angle B is preferably somewhat larger than the angle A.

The growth substrate 61 is optionally replaced with a substitute carrier 62 so that a first electrode 71 for delivering current through the first semiconductor region 21 may be formed. In contrast to the representation of FIG. 1, roughening to improve a light output efficiency may be provided on the first semiconductor region 21, in particular if the growth substrate 61 is removed and there is no carrier on this side of the semiconductor layer sequence 2. There is preferably a second electrode 72 on the second semiconductor region 22. To this end, the second semiconductor region 22 may comprise a semiconductor contact layer (not shown in FIG. 1).

Electrical contacting of, and delivery of current to, the semiconductor chip 1 is carried out for example as described in FIG. 13 and in paragraphs 76 and 77 of printed publication US 2018/0062031 A1. The disclosure content of these passages of this printed publication are incorporated by reference.

Figure 2:
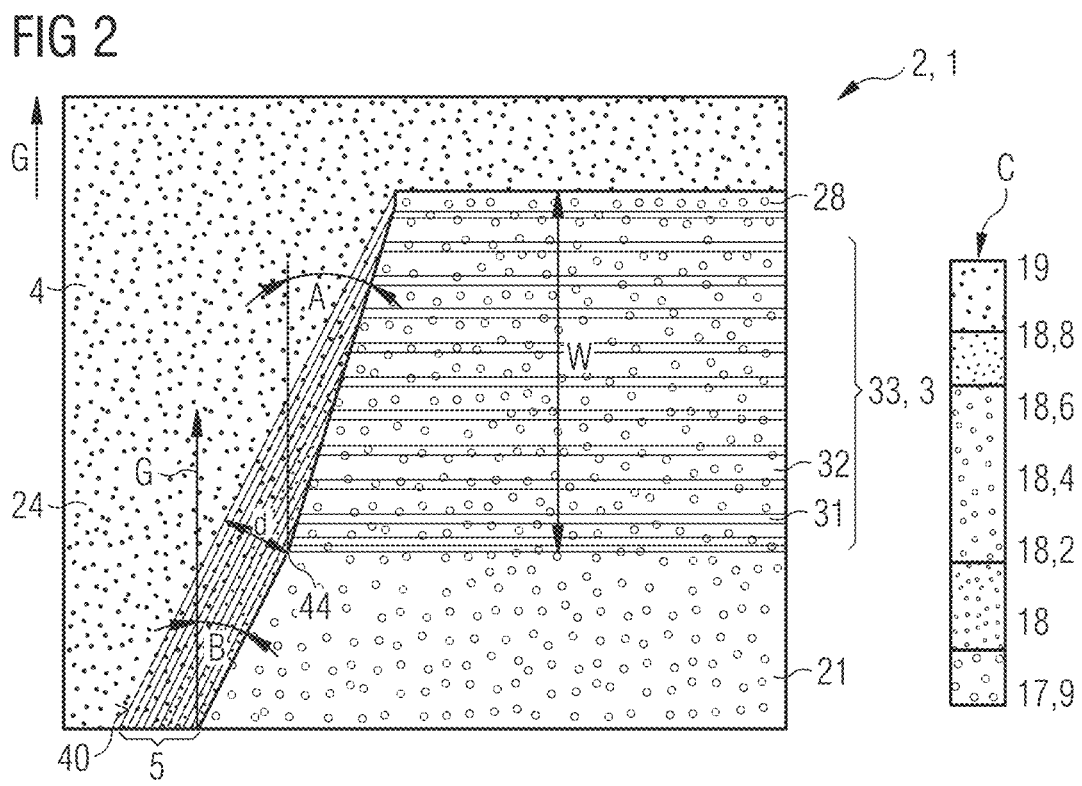
FIG. 2 shows a schematic sectional representation with dopant concentrations of an exemplary embodiment of an optoelectronic semiconductor chip.

FIG. 2 shows a further sectional representation of the semiconductor layer sequence 2 of the semiconductor chip 1. In this case, a dopant concentration C, in particular of magnesium, is indicated by encoding. It is furthermore shown in FIG. 2 that the active zone 3 is a multiple quantum well structure 33, which is formed from a multiplicity of barrier layers 32 and quantum well layers 31 alternating with one another. The active zone 3 may furthermore comprise a cover layer 28, which is for example a barrier layer for electrons.

It may furthermore be seen in FIG. 2 that a side wall 40 of the channel 4 is formed by continuations 5 of the layers of the multiple quantum well structure 33. These layers are thinner on the side walls 40 than in the multiple quantum well structure 33. The multiple quantum well structure 33 therefore has an overall thickness W in the region next to the channels 4. A thickness b of the continuations 5 of the multiple quantum well structure is, however, much less. In particular, the thickness b is about 20% of the overall thickness W.

Because of the relatively small thickness d, achieved by the two aperture angles A, B, the dopant concentration C decreases only relatively little from the sublayer 24, closest to the continuations 5, of the second semiconductor region 22 toward the quantum well layers 31 next to the channels 4. Furthermore, the dopant concentration C changes only relatively little in a direction parallel to the side wall 40, so that all quantum well layers 31 are attached approximately equally strongly conductively to the second semiconductor region 22. Efficient injection of holes is therefore efficiently possible even as far as into the quantum well layers 31 grown first.

Figure 3:
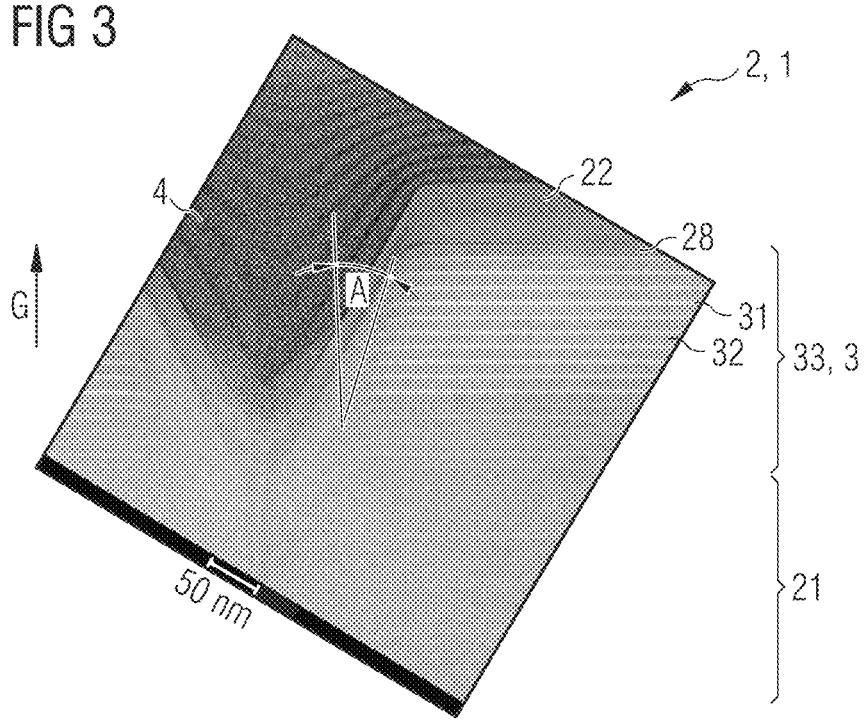
FIG. 3 shows a schematic electron-microscopic image of a section of an exemplary embodiment of an optoelectronic semiconductor chip.

The angle A is determined, in particular, by forming a straight line through bending points of the individual quantum well layers 31 in the region of the side walls 40 of the channel 4. This is again illustrated in the transmission electron-microscopic image in FIG. 3. It may furthermore be seen from FIG. 3 that the layers of the second semiconductor region 22 fully fill, and preferably planarize, the relevant channel 4.

Figure 4:
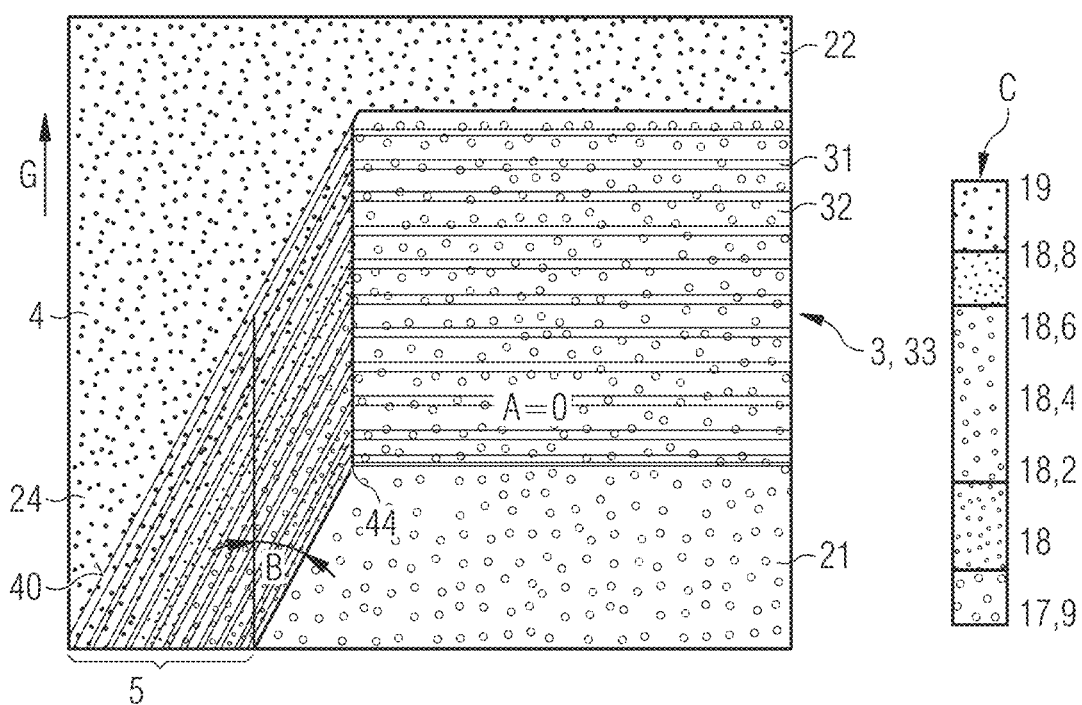
FIG. 4 shows a schematic sectional representation with a dopant concentration distribution of a variant of a semiconductor chip.

FIG. 4 shows a variant 9 of a semiconductor chip. According to FIG. 4, the second aperture angle A is equal to 0° and the side wall 40 therefore extends parallel to the growth direction G. In this way, the continuations 5 of the layers of the multiple quantum well structure 33 on the side wall 40 have a relatively large thickness.

Because of the generally fixed or approximately fixed diffusion length of magnesium, with which the second semiconductor layer 22 is doped, there is a significant dopant concentration gradient over the c-plane areas of the quantum well layers 31. The quantum well layers 31 grown first are therefore delivered considerably less current than the upper quantum well layers 31. This nonuniform delivery of current and charge carrier injection into the quantum well layers 31 is reduced significantly by the channels 4 described here, see FIG. 2.

Figure 5:
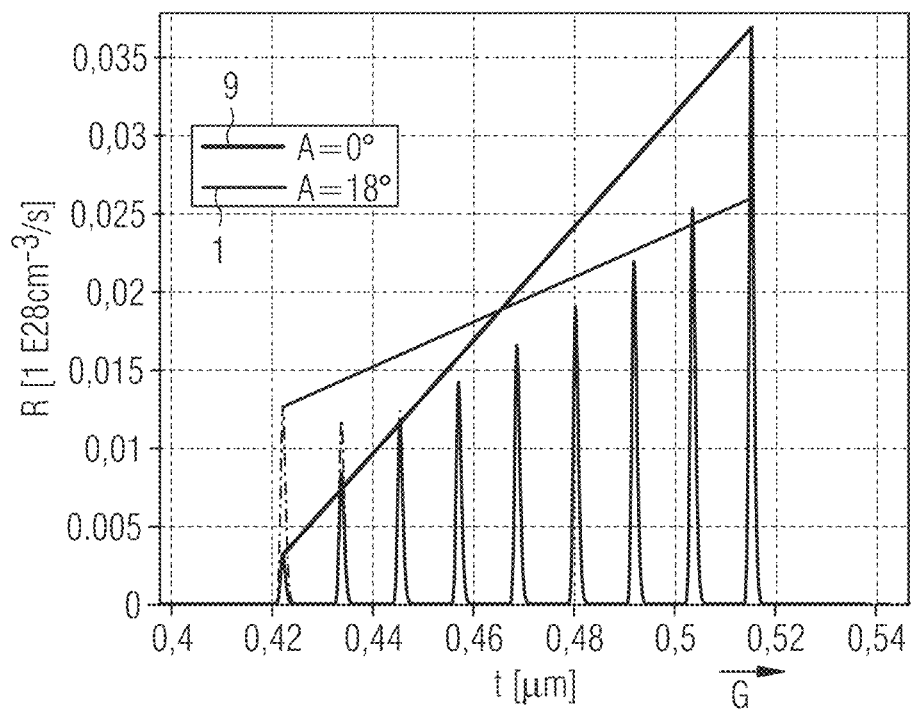
FIGS. 5 and 6 show schematic representations of performance parameters of exemplary embodiments of optoelectronic semiconductor chips.

In FIG. 5, radiative recombination rates R of the individual quantum well layers 31 are indicated as a function of a distance t along the main growth direction G, specifically for a semiconductor chip 1 as described here having an angle A of 18° and for a variant 9 having an angle A of 0°. The data are obtained by configuring the individual quantum well layers for different emission wavelengths and measuring the respectively emitted light in a spectrally resolved fashion.

It may be seen from FIG. 5 that a considerably more uniform charge carrier distribution over the quantum well layers 31 may be achieved for semiconductor chips 1 as described here than with a conventional structure.

Figure 6:
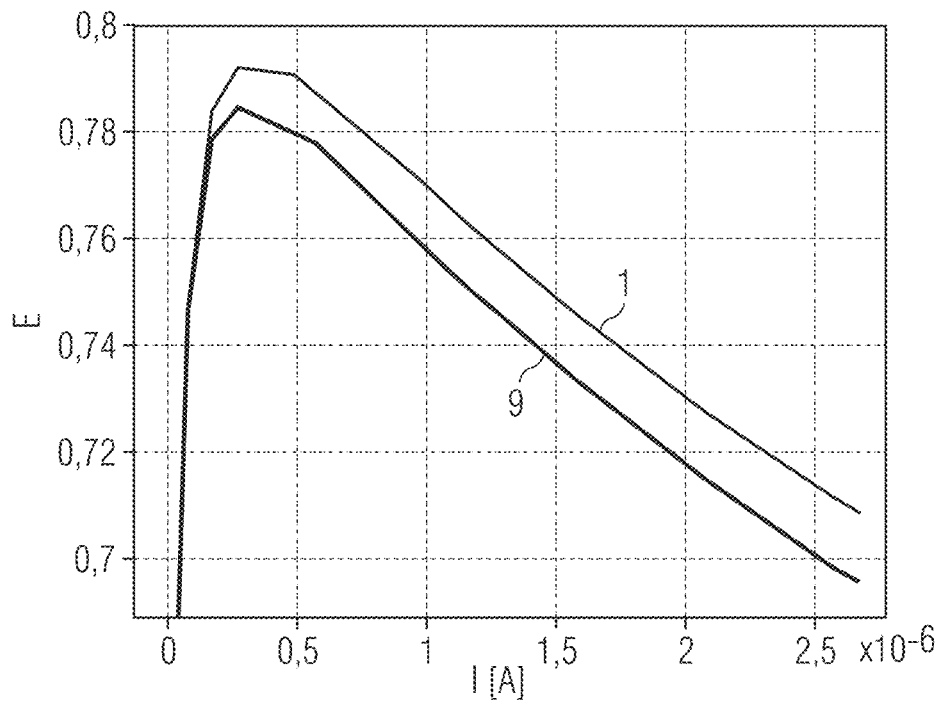

Correspondingly, a semiconductor chip 1 as described here also has an increased efficiency, which is illustrated in FIG. 6. Thus, an operating current I is plotted against the internal efficiency E in FIG. 6. A maximum efficiency E in this example is found at current density of approximately $0.4 \times 10^4$ A/cm². It may be seen that the efficiency is increased over a wide current range, specifically by about 1.6%.

FIGS. 7 to 10 respectively represent schematic plan views of active zones 3. The aperture angles A, B may be adjusted as a function of the respective growth conditions. Due to the material system, the first aperture angle B is respectively 26° or 32°, and primarily the second aperture angle A may be varied.

Figure 7:
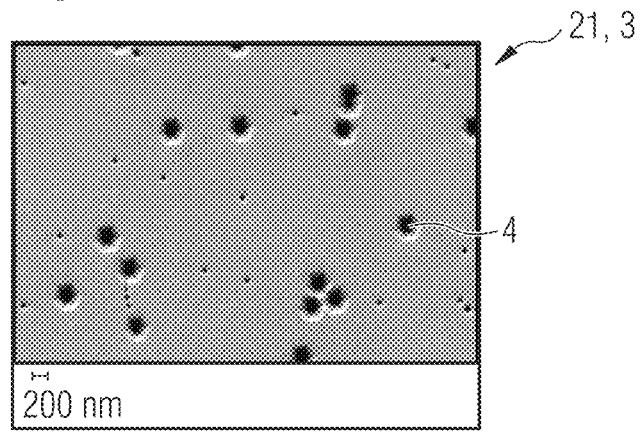
FIGS. 7 to 10 show electron-microscopic images of plan views of active zones for exemplary embodiments of optoelectronic semiconductor chips.

According to FIG. 7, the multiple quantum well structure was grown at a pressure of 200 mbar, there being 17 quantum well layers. The temperature difference between the growth of the barrier layers and of the quantum well layers was 50° C.

Figure 8:
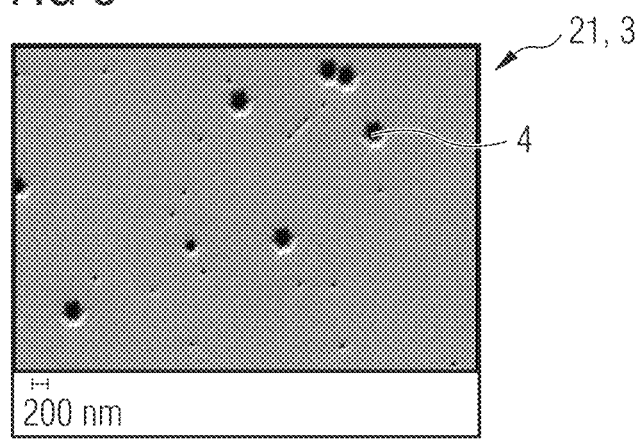

Conversely, the in total 17 quantum well layers of FIG. 8 were grown at a pressure of 400 mbar, with a temperature difference between the growth of the barrier layers and of the quantum well layers of 50° C.

Figure 9:
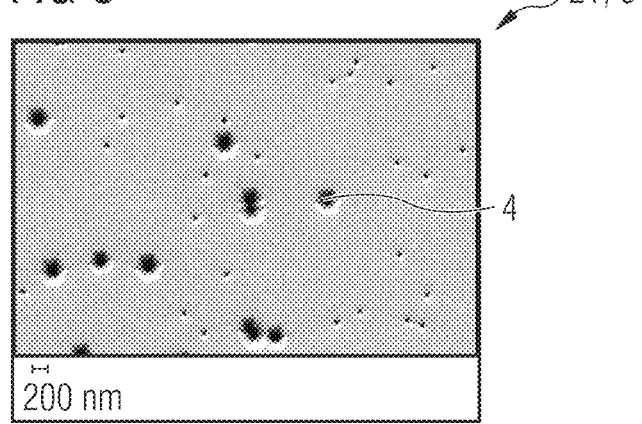

According to FIG. 9, 17 quantum well layers were again grown at a pressure of 400 mbar and a temperature difference between the growth of the barrier layers and of the quantum well layers was 30° C.

Figure 10:
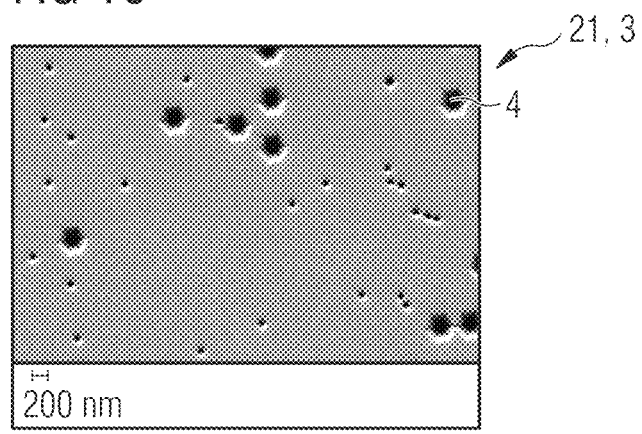

Lastly, according to FIG. 10 rapid growth of the quantum well structure is carried out at a pressure of 200 mbar.

It may be seen from FIGS. 7 to 10 that the second angle A may be increased by reducing a pressure during the growth of the multiple quantum well structure and/or by selecting the temperatures during the growth of the barrier layers to be lower or by setting a high growth rate, in particular for the growth of the barrier layers.

Figure 11:
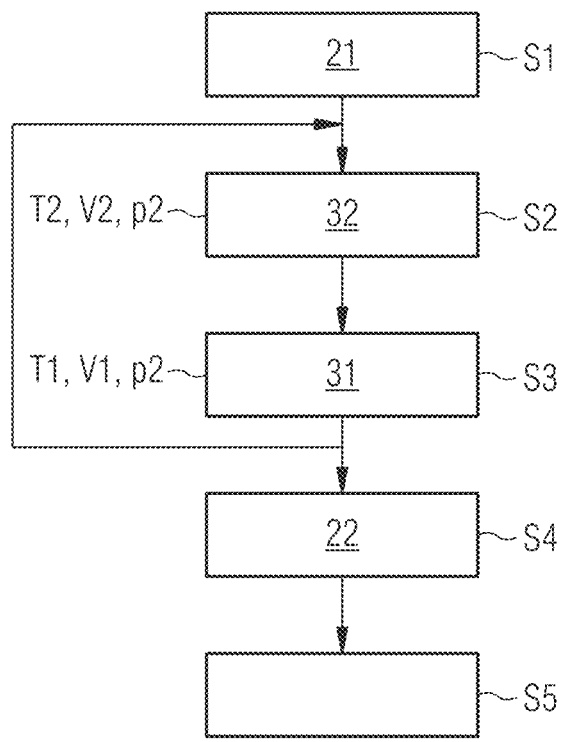
FIG. 11 shows a schematic block diagram of an exemplary embodiment of a production method.

FIG. 11 schematically illustrates a production method for semiconductor chips 1 as described here. In a first method step S1 the first semiconductor region 21 is grown, preferably with a generation layer 25 for the channels 4.

In a second method step S2, a barrier layer 22 is grown at a second temperature T2, at a second pressure p2 and at a second growth rate V2.

A quantum well layer 31 is subsequently grown in the method step S3 with a first temperature T1, at a first pressure p1 and a first growth rate V1. As described in connection with FIGS. 7 to 10, in particular the second aperture half-angle A may be adjusted by means of the growth parameters.

The method steps S2, S3 are repeated until the entire quantum well structure has been fully grown.

Subsequently, the second semiconductor region 22 is produced in method step S4, the channels being filled. This method step S4 may involve thermally induced diffusion, in particular of magnesium as a p-dopant.

In a subsequent method step S5, the application of electrical contact structures, individualization to form individual semiconductor chips and/or removal of a growth substrate, as well as optionally production of roughening in order to improve a light output efficiency, are preferably carried out.

The invention described here is not restricted by the description with the aid of the exemplary embodiments. Rather, the invention includes any new feature and any combination of features, which in particular involves any combination of features in the patent claims, even if this feature or this combination is not itself explicitly indicated in the patent claims or exemplary embodiments.

The invention claimed is:
1. An optoelectronic semiconductor chip comprising:
a semiconductor layer sequence comprising:
   a first semiconductor region of a first conductivity type;
   an active zone configured to generate radiation, the active zone having a multiple quantum well structure composed of a plurality of quantum well layers and barrier layers;
   a second semiconductor region of a second conductivity type; and
   a plurality of channels extending through the active zone and being different and distinct from the active zone,
wherein the active zone lies between the first semiconductor region and the second semiconductor region as seen along a main growth direction of the semiconductor layer sequence,
wherein the second semiconductor region is located in the channels and is configured for lateral current injection into the active zone,
wherein the channels have a first aperture half-angle in the first semiconductor region and a second aperture half-angle in the active zone, and
wherein the second aperture half-angle is greater than zero and less than the first aperture half-angle.
2. The optoelectronic semiconductor chip of claim 1,
wherein the channels are approximately V-shaped in a cross section parallel to the main growth direction, and
wherein the second aperture half-angle is at least 55% and at most 85% of the first aperture half-angle.
3. The optoelectronic semiconductor chip of claim 1,
wherein the semiconductor layer sequence is based on AlInGaN, the first conductivity type is n-conductive and the second conductivity type is p-conductive, and
wherein the first aperture half-angle is between 15° and 35° inclusive.

4. The optoelectronic semiconductor chip of claim 1, wherein the second aperture half-angle is 18°+/−10°.

5. The optoelectronic semiconductor chip of claim 1,
wherein side walls of the channels are formed by more thinly grown continuations of layers of the multiple quantum well structure, and
wherein a dopant concentration of a sublayer, closest to the side walls, of the second semiconductor region in the channels is at least $7\times10^{18}$ per cm$^3$ and decreases by at most 40% toward the multiple quantum well structure.

6. The optoelectronic semiconductor chip of claim 5, wherein the continuations of the layers of the multiple quantum well structure have, in a direction perpendicular to the side walls, a thickness of between 10% and 40% inclusive of an overall thickness of the multiple quantum well structure, measured along the main growth direction and next to the channels.

7. The optoelectronic semiconductor chip of claim 1, wherein the semiconductor chip is configured to provide a charge carrier recombination rate in the quantum well layers that varies by at most a factor of 3 over the multiple quantum well structure.

8. The optoelectronic semiconductor chip of claim 1, wherein a bending point, at which the first aperture half-angle of the channels changes to the second aperture half-angle, lies with a tolerance of at most 50 nm on a first of the quantum well layers along the main growth direction.

9. The optoelectronic semiconductor chip of claim 1, wherein the channels are present in a plan view of the semiconductor layer sequence with a numerical surface density of between $5\times10^7$ per cm$^2$ and $1\times10^9$ per cm$^2$ inclusive.

10. The optoelectronic semiconductor chip of claim 1,
wherein the channels have a diameter of between 150 nm and 450 nm inclusive on a last of the quantum well layers along the main growth direction, and
wherein a thickness of the semiconductor layer sequence is overall between 3 μm and 15 μm inclusive.

11. The optoelectronic semiconductor chip of claim 1,
wherein the first semiconductor region comprises a generation layer, and
wherein at least 80% of the channels are formed in or on the generation layer.

12. The optoelectronic semiconductor chip of claim 1,
wherein each quantum well layer has a thickness of between 2 nm and 5 nm inclusive,
wherein each barrier layer has a thickness of between 4 nm and 15 nm inclusive, and
wherein the active zone comprises between 5 and 20 of the quantum well layers inclusive.

13. The optoelectronic semiconductor chip of claim 1, wherein the optoelectronic semiconductor chip is a light-emitting diode configured to generate blue light and/or green light and/or yellow light and/or red light and/or ultraviolet radiation.

14. A production method for optoelectronic semiconductor chips, wherein each semiconductor chip is the semiconductor chip of claim 1, the method comprising:
growing the first semiconductor region and initiating the channels, the channels growing with the first aperture half-angle;
growing the active zone, the channels growing with the second aperture half-angle; and
growing the second semiconductor region and filling the channels with a semiconductor material of the second semiconductor region.

15. The method of claim 14,
wherein the barrier layers are grown at a temperature which is at least 20° C. and at most 70° C. higher than a temperature during a growth of the quantum well layers, and both temperatures are between 700° C. and 950° C. inclusive, and
wherein the barrier layers are grown undoped from GaN and the quantum well layers are grown undoped from InGaN, and a growth rate for the quantum well layers is less than for the barrier layers.

16. An optoelectronic semiconductor chip comprising:
a semiconductor layer sequence comprising:
a first semiconductor region of a first conductivity type;
an active zone configured to generate radiation, the active zone having a multiple quantum well structure composed of a plurality of quantum well layers and barrier layers;
a second semiconductor region of a second conductivity type; and
a plurality of channels extending through the active zone and being different and distinct from the active zone,
wherein the active zone lies between the first semiconductor region and the second semiconductor region as seen along a main growth direction of the semiconductor layer sequence,
wherein the second semiconductor region is located in the channels and is configured for lateral current injection into the active zone,
wherein each channel of at least some of the channels has a first aperture half-angle in the first semiconductor region and a second aperture half-angle in the active zone, and
wherein the second aperture half-angle is greater than zero and less than the first aperture half-angle.

17. The optoelectronic semiconductor chip of claim 16,
wherein the first aperture half-angle is between 15° and 35° inclusive, and
wherein the second aperture half-angle is at least 55% and at most 85% of the first aperture half-angle.

18. The optoelectronic semiconductor chip of claim 17, wherein the second aperture half-angle is 18°+/−10°.

19. The optoelectronic semiconductor chip of claim 16,
wherein the semiconductor layer sequence is based on AlInGaN,
wherein the first conductivity type is n-conductive, and
wherein the second conductivity type is p-conductive.

20. An optoelectronic semiconductor chip comprising:
a semiconductor layer sequence comprising:
a first semiconductor region of a first conductivity type;
an active zone configured to generate radiation, the active zone having a multiple quantum well structure composed of a plurality of quantum well layers and barrier layers;
a second semiconductor region of a second conductivity type; and
a plurality of channels extending orthogonally through a main extension direction of the active zone,
wherein the active zone lies between the first semiconductor region and the second semiconductor region as seen along a main growth direction of the semiconductor layer sequence,
wherein the second semiconductor region is located in the channels and is configured for lateral current injection into the active zone, wherein the channels have a first aperture half-angle in the first semiconductor region and a second aperture half-angle in the active zone, and wherein the second aperture half-angle is greater than zero and less than the first aperture half-angle.

\* \* \* \* \*